(12) United States Patent
Ito et al.

(10) Patent No.: US 10,490,466 B2
(45) Date of Patent: Nov. 26, 2019

(54) SEMICONDUCTOR MANUFACTURING METHOD AND SEMICONDUCTOR MANUFACTURING APPARATUS

(71) Applicant: Toshiba Memory Corporation, Minato-ku (JP)

(72) Inventors: Kazumasa Ito, Kawasaki (JP); Seiichi Omoto, Yokkaichi (JP); Takanobu Itoh, Yokkaichi (JP); Ryota Nakanishi, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 11 days.

(21) Appl. No.: 15/878,833

(22) Filed: Jan. 24, 2018

(65) Prior Publication Data
US 2018/0151457 A1    May 31, 2018

Related U.S. Application Data

(62) Division of application No. 15/014,718, filed on Feb. 3, 2016, now abandoned.

(Continued)

(51) Int. Cl.
| | |
|---|---|
| *H01L 27/11582* | (2017.01) |
| *H01L 21/768* | (2006.01) |
| *H01L 21/66* | (2006.01) |
| *C23C 16/06* | (2006.01) |
| *C23C 16/52* | (2006.01) |
| *C23C 16/04* | (2006.01) |
| *H01L 27/1157* | (2017.01) |

(52) U.S. Cl.
CPC ............ *H01L 22/26* (2013.01); *C23C 16/045* (2013.01); *C23C 16/06* (2013.01); *C23C 16/52* (2013.01); *H01L 21/76879* (2013.01); *H01L 27/1157* (2013.01); *H01L 27/11582* (2013.01)

(58) Field of Classification Search
CPC ....... C23C 16/045; C23C 16/06; C23C 16/52; H01L 21/76879; H01L 27/1157; H01L 27/11582

See application file for complete search history.

(56) References Cited

U.S. PATENT DOCUMENTS

| | | |
|---|---|---|
| 2014/0129203 A1 | 5/2014 | Kuboi |
| 2014/0349477 A1 | 11/2014 | Chandrashekar et al. |

(Continued)

FOREIGN PATENT DOCUMENTS

| | | |
|---|---|---|
| JP | 1-313929 | 12/1989 |
| JP | 7-221028 | 8/1995 |
| JP | 2015-38964 | 2/2015 |

*Primary Examiner* — Joseph M Galvin, III
(74) *Attorney, Agent, or Firm* — Oblon, McClelland, Maier & Neustadt, L.L.P.

(57) ABSTRACT

A semiconductor manufacturing method according to an embodiment includes forming a first film on a semiconductor substrate. The semiconductor manufacturing method includes forming cavities in the first film. The semiconductor manufacturing method includes forming a second film inside the cavities by a CVD method using first gas containing a component of the second film, detecting a first time point at which the second film blocks openings of the cavities in forming the second film, and ending forming of the second film at a second time point at which a predetermined time has elapsed from the first time point.

6 Claims, 7 Drawing Sheets

Related U.S. Application Data

(60) Provisional application No. 62/212,737, filed on Sep. 1, 2015.

(56) References Cited

U.S. PATENT DOCUMENTS

| | | | |
|---|---|---|---|
| 2015/0236038 A1 | 8/2015 | Pachamuthu | |
| 2015/0371882 A1* | 12/2015 | Tsai | H01L 21/67253 156/345.25 |
| 2016/0020169 A1* | 1/2016 | Matsuda | H01L 23/528 257/758 |

* cited by examiner

SEMICONDUCTOR MANUFACTURING METHOD AND SEMICONDUCTOR MANUFACTURING APPARATUS

CROSS REFERENCE TO RELATED APPLICATIONS

This application is a division of and claims the benefit of priority under 35 U.S.C. § 120 from U.S. application Ser. No. 15/014,718 filed Feb. 3, 2016, and claims the benefit of priority from U.S. Provisional Patent Application No. 62/212,737 filed Sep. 1, 2015, the entire contents of each of which are incorporated herein by reference.

FIELD

Embodiments relate to a semiconductor manufacturing method and a semiconductor manufacturing apparatus.

BACKGROUND

In a manufacturing process of a three-dimensionally stacked memory, a stacked film of silicon oxide films and silicon nitride films is formed on a wafer, trenches penetrating the stacked film are formed, and thereafter a chemical liquid is brought into contact with the silicon nitride films through the trenches to remove the silicon nitride films selectively from the stacked film. Subsequently, to form word lines, a CVD method using material gas is performed to form tungsten films inside cavities in respective layers from which the silicon nitride films have been removed.

The tungsten films are formed not only inside the cavities in the respective layers but also on the sidewalls of the trenches communicated with the cavities. The tungsten films on the sidewalls of the trenches are continuous with the tungsten films in the cavities of upper layers and the tungsten films in the cavities of lower layers, respectively. If the tungsten films remain continuous with one another, upper and lower word lines mutually short-circuit. Accordingly, to isolate the upper and lower word lines electrically, the tungsten films on the sidewalls of the trenches are removed by etching.

Conventionally, a time point at which a predetermined time has elapsed from start of film formation is used as an end point of the film formation. In some cases, a difference in film-formation rates of the tungsten films is generated between when the cavities remain opened, that is, when the surface area of the stacked film is large and when the cavities are blocked, that is, when the surface area of the stacked film is small. Under this premise, when the shapes of the openings of the cavities are non-uniform among different wafers (lots), the film thicknesses of the tungsten films on the sidewalls of the trenches are also non-uniform at an end point of film formation. When the film thicknesses of the tungsten films on the sidewalls of the trenches are non-uniform, etching conditions of the tungsten films on the sidewalls of the trenches cannot be uniformed among wafers. Accordingly, the manufacturing efficiency becomes poor.

Furthermore, conventionally, the flow rate of material gas is kept constant from start to an end point of film formation. For this reason, after the openings of the cavities are blocked by the tungsten films, an excessive amount of material gas is supplied until the end point of film formation. Accordingly, the economic efficiency becomes poor.

Therefore, in manufacturing semiconductor devices, improvement in manufacturing efficiency and economical efficiency has been demanded.

DETAILED DESCRIPTION

A semiconductor manufacturing method according to an embodiment includes forming a first film on a semiconductor substrate. The semiconductor manufacturing method includes forming cavities in the first film. The semiconductor manufacturing method includes forming a second film inside the cavities by a CVD method using first gas containing a component of the second film, detecting a first time point at which the second film blocks openings of the cavities in forming the second film, and ending forming of the second film at a second time point at which a predetermined time has elapsed from the first time point.

Embodiments will now be explained with reference to the accompanying drawings. The present invention is not limited to the embodiments.

Figure 1:
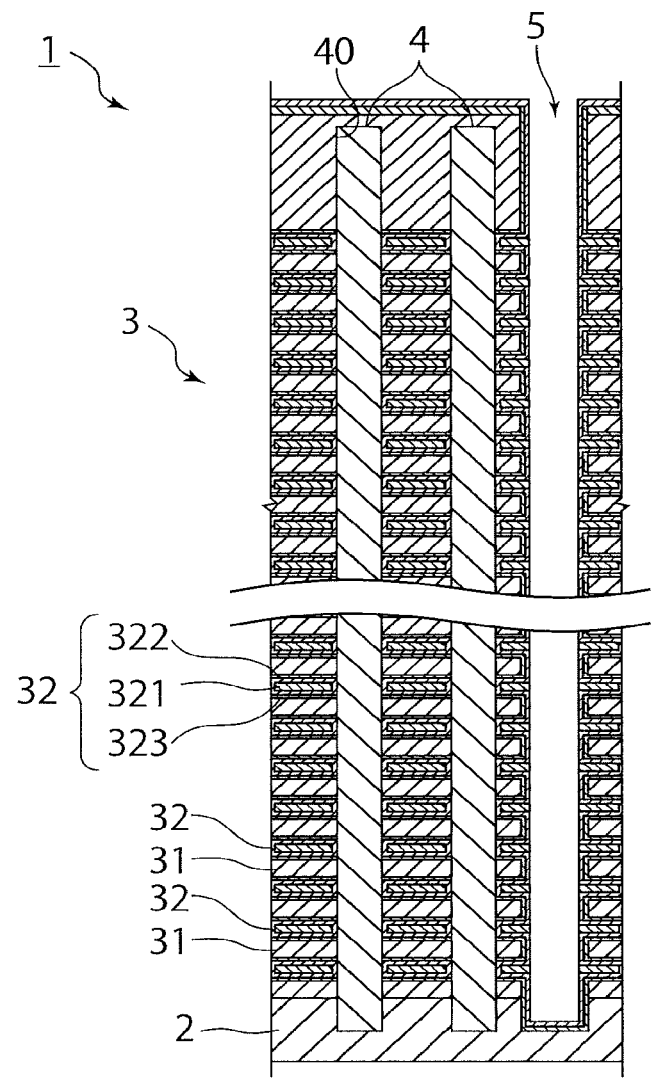
FIG. 1 is a schematic sectional view showing a semiconductor storage device according to an embodiment.

FIG. 1 is a schematic sectional view showing a semiconductor storage device 1 manufactured by a semiconductor manufacturing method according to an embodiment. The semiconductor storage device 1 includes a semiconductor substrate 2, a first stacked film 3, and memory cells 4.

The semiconductor substrate 2 has a diffusion layer (not shown) on a surface thereof.

The first stacked film 3 is arranged on the semiconductor substrate 2. The first stacked film 3 includes insulating layers 31 and conductive layers 32. The insulating layers 31 and the conductive layers 32 are stacked alternately and repeatedly. The insulating layers 31 are silicon oxide films. The conductive layers 32 each include a tungsten (W) film 321 that is an example of a second film, a TiN film 322 for growing tungsten, and an AlO film 323 that is a block film. The tungsten film 321 is in contact with the TiN film 322. The TiN film 322 is in contact also with the AlO film 323. The AlO film 323 is in contact also with the insulating layer 31.

For example, the conductive layers 32 are word lines. The conductive layers 32 may include select gate lines.

The memory cells 4 are each formed into a columnar shape and are embedded in memory holes 40 that penetrate the first stacked film 3. The memory cells 4 each include a silicon pillar (polysilicon) and a charge accumulating layer surrounding the silicon pillar. For example, the charge accumulating layer has an ONO (oxide/nitride/oxide) structure.

The semiconductor storage device 1 has trenches 5 that are an example of a recess. The trenches 5 penetrate the first stacked film 3.

A manufacturing method for manufacturing the semiconductor storage device 1 in FIG. 1 is explained next.

Figure 2A:
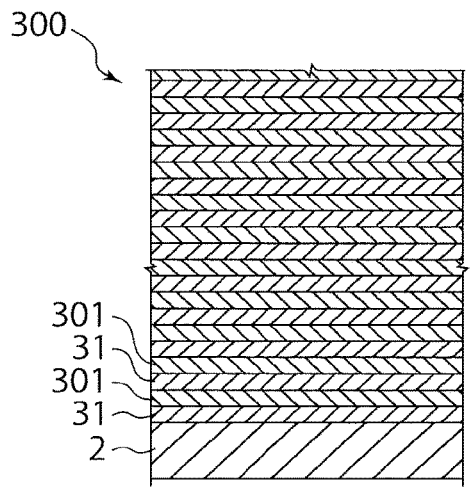
FIG. 2A is a sectional view showing a semiconductor manufacturing method according to the embodiment.

FIG. 2A is a sectional view showing a semiconductor manufacturing method according to the present embodiment. First, as shown in FIG. 2A, the silicon oxide films 31 and the silicon nitride films 301 are stacked alternately on the semiconductor substrate 2 to form a second stacked film 300. The second stacked film 300 is an example of a first film. For example, the silicon oxide films 31 and the silicon nitride films 301 may be formed by a CVD method.

Figure 2B:
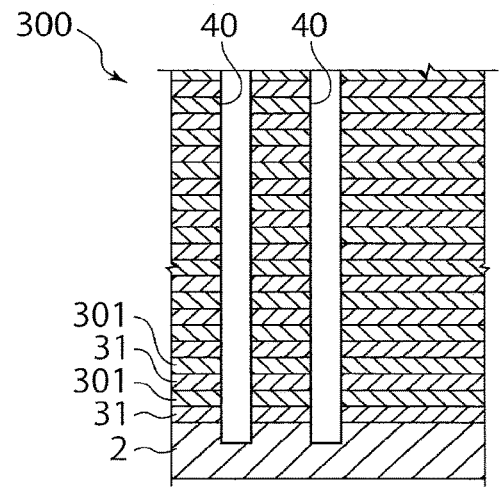
FIG. 2B is a sectional view showing the semiconductor manufacturing method after FIG. 2A.

FIG. 2B is a sectional view showing the semiconductor manufacturing method after FIG. 2A. After the second stacked film 300 is formed, the memory holes 40 penetrating the second stacked film 300 are formed as shown in FIG. 2B. For example, the memory holes 40 may be formed by reactive ion etching (RIE).

Figure 3A:
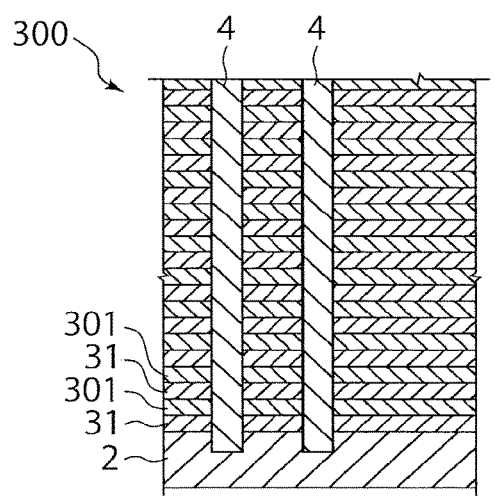
FIG. 3A is a sectional view showing the semiconductor manufacturing method according to the embodiment after FIG. 2B.

FIG. 3A is a sectional view showing the semiconductor manufacturing method according to the present embodiment after FIG. 2B. After the memory holes 40 are formed, the memory cells 4 are formed in the memory holes 40 as shown in FIG. 3A. For example, the memory cells 4 may be formed by the CVD method.

Figure 3B:
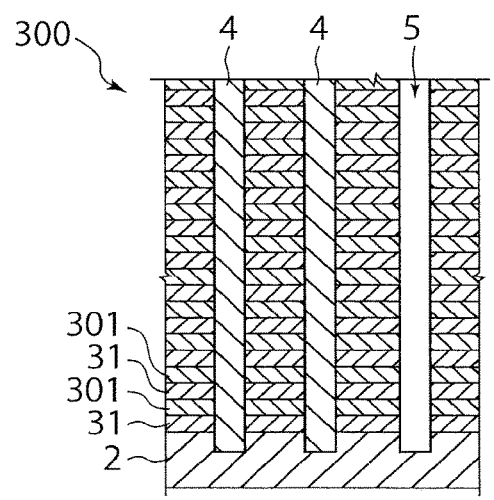
FIG. 3B is a sectional view showing the semiconductor manufacturing method after FIG. 3A.

FIG. 3B is a sectional view showing the semiconductor manufacturing method according to the present embodiment after FIG. 3A. After the memory cells 4 are embedded, the trenches 5 penetrating the second stacked film 300 are formed as shown in FIG. 3B. For example, the trenches 5 may be formed by RIE.

Figure 4A:
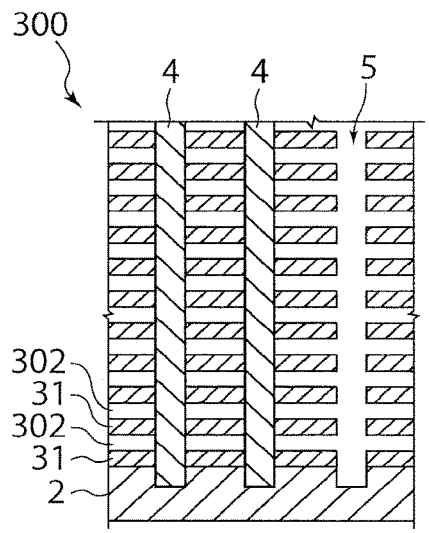
FIG. 4A is a sectional view showing the semiconductor manufacturing method according to the embodiment after FIG. 3B.

FIG. 4A is a sectional view showing the semiconductor manufacturing method according to the present embodiment after FIG. 3B. After the trenches 5 are formed, the silicon nitride films 301 are selectively removed from the second stacked film 300 to form cavities 302 between the silicon oxide films 31 in respective layers as shown in FIG. 4A. The cavities 302 are formed by wet etching in which a chemical liquid is brought into contact with the silicon nitride films 301 through the trenches 5. The chemical liquid may be a heated phosphoric acid solution. Hereinafter, a stacked film obtained by removing the silicon nitride films 301 from the second stacked film 300 is also referred to as "third stacked film 310". The third stacked film 310 is an example of the first film having cavities.

Figure 4B:
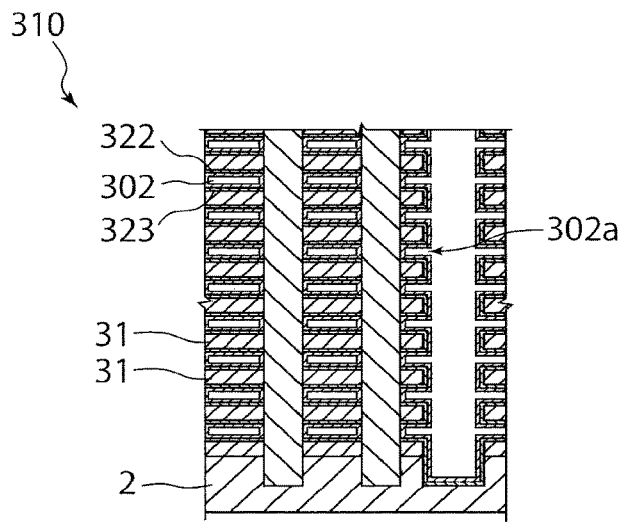
FIG. 4B is a sectional view showing the semiconductor manufacturing method after FIG. 4A.

FIG. 4B is a sectional view showing the semiconductor manufacturing method after FIG. 4A. After the cavities 302 are formed, the AlO films 323 and the TiN films 322 are formed sequentially on the inner walls of the cavities 302 and the sidewalls of the trenches 5 as shown in FIG. 4B. For example, the AlO films 323 and the TiN films 322 may be formed by the CVD method.

Next, the tungsten films 321 are formed to fill the cavities 302. At that time, the tungsten films 321 are formed to extend from the insides of the cavities 302 to the inner walls (the sidewalls and the bottom walls) of the trenches 5 and the upper wall of the third stacked film 310.

Figure 5:
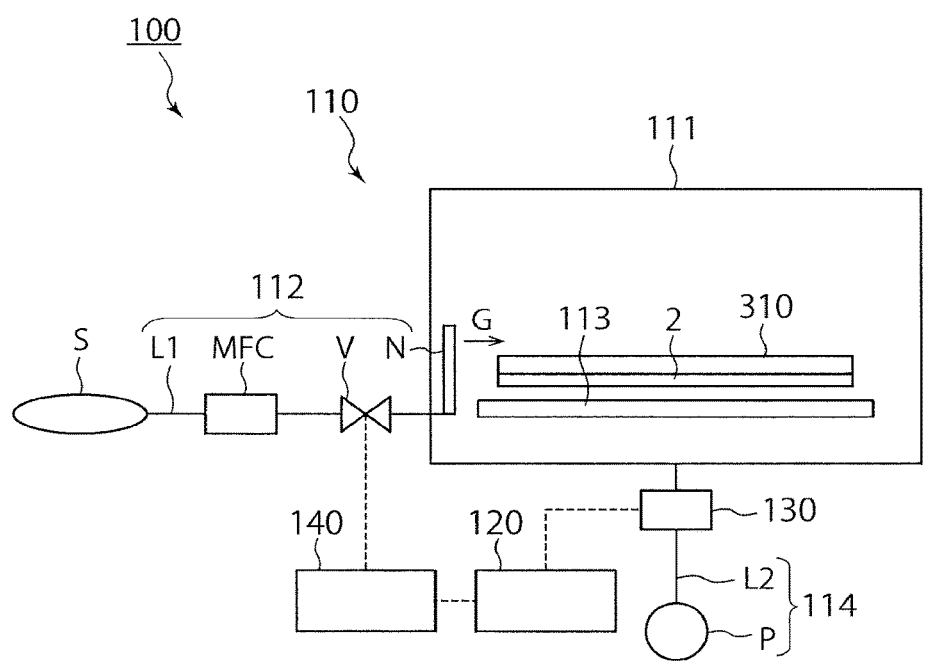
FIG. 5 is a schematic diagram showing a semiconductor manufacturing apparatus according to the embodiment.

FIG. 5 is a schematic diagram showing a semiconductor manufacturing apparatus 100 according to the present embodiment. The tungsten films 321 are formed with the semiconductor manufacturing apparatus 100 in FIG. 5. The semiconductor manufacturing apparatus 100 is a CVD apparatus that forms films by the CVD method. As shown in FIG. 5, the semiconductor manufacturing apparatus 100 includes a reactor 110, a first detector 120, a second detector 130, and a controller 140.

The reactor 110 includes a reaction furnace 111, a gas supplier 112, a heater 113, and a gas discharge part 114.

The reaction furnace 111 houses the semiconductor substrate 2 with the third stacked film 310. The reaction furnace 111 can include a holder (not shown) that holds the semiconductor substrate 112.

The gas supplier 112 includes a nozzle N and ejects material gas G supplied from a gas source S through a supply line L1 to the semiconductor substrate 2. The material gas G is an example of first gas. The gas supplier 112 further includes a valve V and a mass flow controller MFC on the supply line L1. The valve V can open and close the supply line L1. The mass flow controller MFC can control the flow rate of the material gas G.

The heater 113 thermally decomposes the material gas G supplied from the gas supplier 112 and generates film formation species to form the tungsten films 321 in the cavities 302. The heater 113 may be provided inside the reaction furnace 111 as shown in FIG. 5. Alternatively, the heater 113 may surround the sidewall of the reaction furnace 111 at the outside of the reaction furnace 111.

The gas discharge part 114 includes a discharge line L2 and a discharge pump P. The gas discharge part 114 discharges gas in the reaction furnace 111 to the outside of the reaction furnace 111 through the discharge line L2 by a suction force of the discharge pump P.

The second detector 130 is arranged on the discharge line L2. The second detector 130 detects an amount of byproducts that are generated in the reaction furnace 111 when the tungsten films 321 are formed.

For example, while tungsten hexafluoride (WF6) gas and hydrogen gas ($3H_2$), which are examples of the material gas, are caused to react with each other to generate tungsten (W), hydrogen fluoride gas (6HF) is simultaneously generated as a byproduct. The second detector 130 may detect an amount of hydrogen fluoride gas that is an example of second gas as an amount of byproducts.

Alternatively, the second detector 130 may detect the amount of byproducts by infrared spectroscopy (IR).

The first detector 120 detects a time point (hereinafter, "opening-blocking time point") at which the tungsten films 321 block openings 302a (see FIG. 4B) of the cavities 302. The opening-blocking time point is an example of a first time point. The openings 302a of the cavities 302 can be also considered to be boundaries between the cavities 302 and the trenches 5. The first detector 120 detects a time point at which the amount of byproducts detected by the second detector 130 has decreased as the opening-blocking time point. The first detector 120 can be embodied as an arithmetic processing unit such as a CPU. The controller 140 may also serve as the first detector 120.

The controller 140 executes control to stop supply of the material gas G at a time point (hereinafter, also "film-formation end point") at which a predetermined time has elapsed from the opening-blocking time point. The film-formation end point is an example of a second time point. The controller 140 may close the valve V to stop supply of the material gas G. The controller 140 can control the whole operation of the semiconductor manufacturing apparatus 100.

As described above, the semiconductor manufacturing apparatus 100 detects an opening-blocking time point that may be different among the semiconductor substrates 2 (lots) as a reference time point for detecting a film-formation end point.

The semiconductor manufacturing apparatus 100 uses a time point at which a predetermined time has elapsed from the detected opening-blocking time point as a film-formation end point to absorb variation in the opening-blocking time point among the semiconductor substrates 2.

More specifically, in forming the tungsten films 321, the semiconductor manufacturing apparatus 100 operates as follows.

Figure 6:
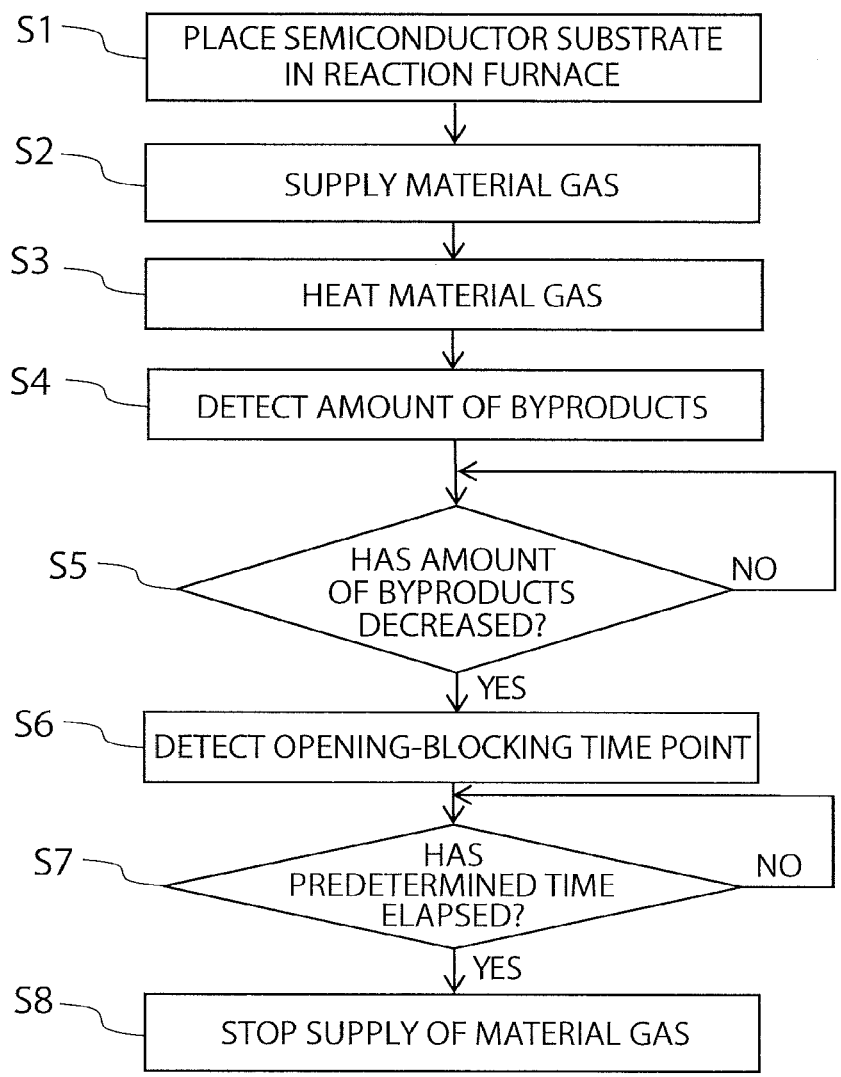
FIG. 6 is a flowchart showing a formation process of tungsten films in the semiconductor manufacturing method according to the embodiment.

FIG. 6 is a flowchart showing a formation process of the tungsten films 321 in the semiconductor manufacturing method according to the present embodiment.

As shown in FIG. 6, first, the semiconductor manufacturing apparatus 100 places the semiconductor substrate 2 with the third stacked film 310 inside the reaction furnace 111 using an automatic conveying mechanism (not shown) (Step S1).

Next, the gas supplier 112 supplies the material gas G to the inside of the reaction furnace 111 (Step S2).

Next, the heater 113 heats the material gas G supplied to the inside of the reaction furnace 111 to start forming the tungsten films 321 in the cavities 302 of the semiconductor substrate 2 (Step S3). The tungsten films 321 may be formed on the inner walls of the cavities 302, the inner walls of the trenches 5, and the upper wall of the third stacked film 310, respectively, at an equal film-formation rate.

In forming the tungsten films 321, a main tungsten film with a low resistance may be formed after forming an initial tungsten film that is less likely to generate film-formation delay. For example, $B_2H_6$, $SiH_4$, or $SiH_4$ and $H_2$ are used as reducing gas for the initial film. For example, $H_2$ is used as reducing gas for the main film.

Next, the second detector 130 detects an amount of byproducts inside the reaction furnace 111 at the discharge line L2 (Step S4).

Next, to detect the opening-blocking time point, the first detector 120 determines whether the amount of byproducts has 10 decreased based on the amount of byproducts detected by the second detector 130 (Step S5).

The reason why the opening-blocking time point can be detected by determining whether the amount of byproducts has decreased is as follows.

The film-formation rate of the tungsten films 321 formed of the initial film and the main film described above was calculated. The film-formation rate before the openings 302*a* were blocked was 0.045 nm/sec. The film-formation rate after the openings 302*a* were blocked was 0.195 nm/sec. That is, the film-formation rate after the openings 302*a* were blocked was approximately four times larger than that before the openings 302*a* were blocked.

The change rate of the surface area of the third stacked film 310 was also calculated. The surface area after the openings 302*a* were blocked was 5.6% of that before the openings 302*a* were blocked.

The generation amount of hydrogen fluoride as a byproduct was calculated based on the film-formation rate and the change rate of the surface area. The generation amount before the opening 302*a* was blocked was 2.07 nm/sec. The generation amount after the openings 302*a* were blocked was 0.51 nm/sec. That is, the generation amount of byproducts after the openings 302*a* were blocked was approximately one fourth of that before the openings 302*a* were blocked.

As described above, blocking the openings 302*a* is accompanied by decrease in the generation amount of byproducts. Therefore, decrease in the generation amount of byproducts can be an indicator for determining whether the openings 302*a* are blocked.

For the above reason, the opening-blocking time point can be detected by determining whether the amount of byproducts has decreased.

When the amount of byproducts has not decreased (Step S5: No), the first detector 120 does not detect the opening-blocking time point. In this case, the first detector 120 repeats the determination (Step S5).

Figure 7A:
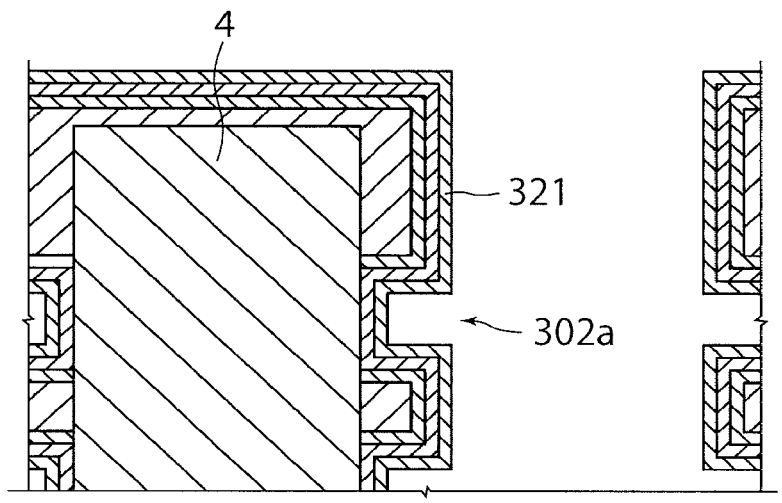
FIGS. 7A and 7B are sectional views showing the semiconductor manufacturing method after FIG. 4B.
Figure 7B:
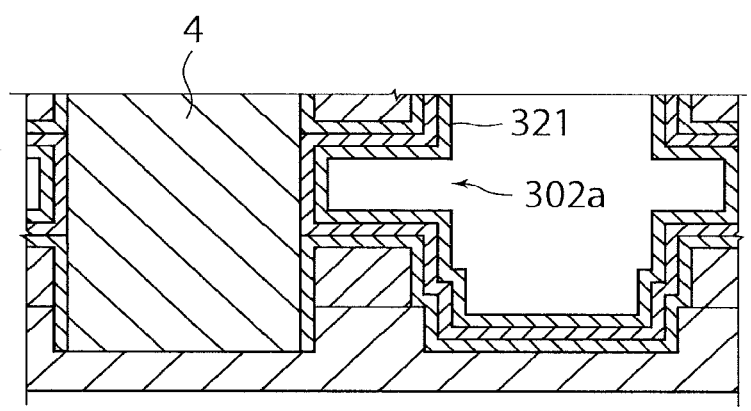

FIGS. 7A and 7B are sectional views showing the semiconductor manufacturing method after FIG. 4B. FIG. 7A shows a state where the tungsten films 321 near the upper ends of the memory cells 4 do not block the openings 302*a*. FIG. 7B shows a state where the tungsten films 321 near the lower ends of the memory cells 4 do not block the openings 302*a*.

In a state where the openings 302*a* are not blocked (Step S5: No) as shown in FIGS. 7A and 7B, it is difficult to detect the film-formation end point with accuracy because a required time for blocking the openings 302*a* may vary depending on the shape of the openings 302*a*. If a delay time of start of film formation is detected based on the detected amount of byproducts before the openings 302*a* are blocked and a time point at which a predetermined time has lapsed from the delay time is used as a film-formation end point, a film-formation end point in consideration of variation in the shape of the openings 302*a* (that is, variation in the surface area of the cavities 302) among the semiconductor substrates 2 cannot be obtained. When no consideration can be given to variation in the shape of the openings 302*a*, the film-formation end point may be too early for the semiconductor substrate 2 that requires a long time for blocking the openings 302*a* while the film-formation end point may be too late for the semiconductor substrate 2 that requires a short time for blocking the openings 302*a*. In this case, if different semiconductor substrates 2 use the same etching condition for tungsten films on the sidewalls of trenches, the tungsten films on the sidewalls of the trenches are excessively thin in the semiconductor substrate 2 for which the film-formation end point is too early and thus the tungsten films 321 in the cavities 302 are also etched. If the tungsten films 321 in the cavities 302 are etched, word lines cannot provide desired electrical characteristics. In the semiconductor substrate 2 for which the film-formation end point is too late, the tungsten films on the sidewalls of the trenches are excessively thick and thus the tungsten films on the sidewalls of the trenches cannot be completely removed. If the tungsten films on the sidewalls of the trenches are not completely removed, the upper and lower conductive layers 32 mutually short-circuit.

On the other hand, according to the present embodiment, the film-formation end point is detected by using as a reference (a starting point) not a time point before the openings 302*a* are blocked such as a film-formation delay time but the opening-blocking time point as described later. When the opening-blocking time point is used as a reference, an optimum film-formation end point that enables etching of the tungsten films on the sidewalls of the trenches in appropriate amounts under the same etching condition can be detected regardless of variation in the shape of the openings 302a among different semiconductor substrates 2 (lots).

When the amount of byproducts has decreased (Step S5: Yes) in the above determination (Step S5), the first detector 120 detects (determines) a current time point (clock time) as the opening-blocking time point (Step S6).

Figure 8A:
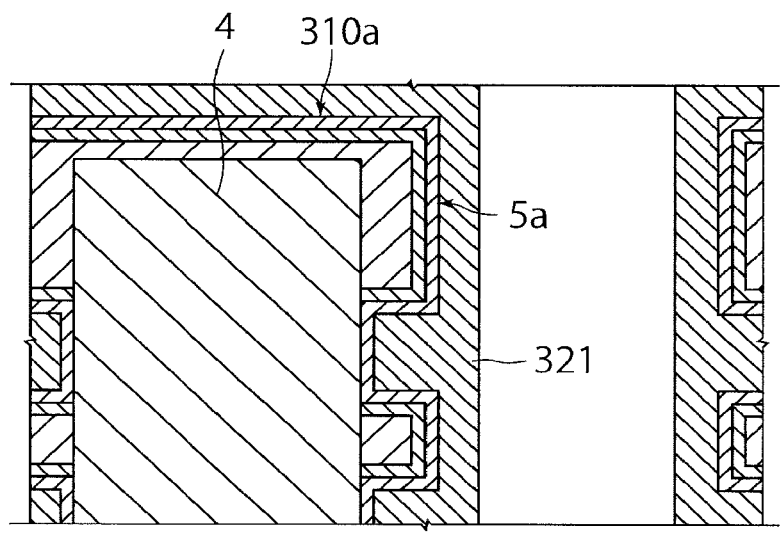
FIGS. 8A and 8B are sectional views showing the semiconductor manufacturing method after FIGS. 7A and 7B.
Figure 8B:
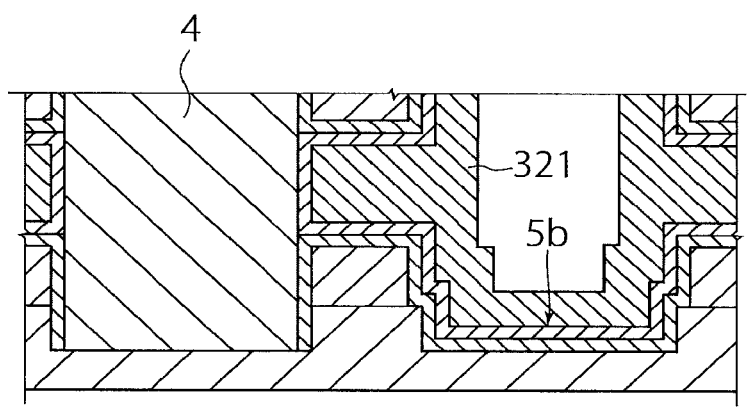

FIGS. 8A and 8B are sectional views showing the semiconductor manufacturing method after FIGS. 7A and 7B. FIG. 8A shows the tungsten films 321 that have blocked the openings 302a near the upper ends of the memory cells 4. FIG. 8B shows the tungsten films 321 that have blocked the openings 302a near the lower ends of the memory cells 4.

At the opening-blocking time point, the film thickness of the tungsten films 321 on sidewalls 5a is relatively thin at positions facing the openings 302a due to the recesses of the cavities 302. To prevent excessive etching of the tungsten films 321 at the positions facing the openings 302a, it is preferable that the film thickness of the tungsten films 321 on the sidewalls 5a be formed to be sufficiently thick by continuing the film formation after the opening-blocking time point. As shown in FIGS. 8A and 8B, the openings 302a are already blocked at the opening-blocking time point. For this reason, in forming the tungsten films 321 after the opening-blocking time point, it is not necessary to give consideration to variation in the required time for blocking the openings 302a due to variation in the shape of the openings 302a among different semiconductor substrates 2. After the opening-blocking time point, the tungsten films 321 are formed on the inner walls (the sidewalls 5a and bottom walls 5b) of the trenches 5 and an upper wall 310a of the third stacked film 310. The surface area of these portions 5a, 5b, and 310a is far smaller than the surface area of the cavities 302. Therefore, even when the shapes of the inner walls 5a and 5b of the trenches 5 and the upper wall 310a of the third stacked film 310 vary among different semiconductor substrates 2, such variation can be considered to have little influence on the film thickness of the tungsten films 321. That is, after the opening-blocking time point, the film-formation rates of the tungsten films 321 in different semiconductor substrates 2 can be considered to be almost identical with one another.

For the above reasons, in the present embodiment, also after the opening-blocking time point, forming the tungsten films 321 is continued while a time point at which a predetermined time has elapsed from the opening-blocking time point is used as the film-formation end point.

More specifically, the controller 140 determines whether a predetermined time has elapsed from the opening-blocking time point (Step S7). When the predetermined time has elapsed (Step S7: Yes), the controller 140 executes control to stop supply of the material gas (Step S8). When the predetermined time has not elapsed (Step S7: No), the controller 140 repeats the determination (Step S7).

In this manner, when a time point at which a predetermined time has elapsed from the opening-blocking time point is used as the film-formation end point, the film thicknesses of the tungsten films 321 on the sidewalls of the trenches can be equalized among different semiconductor substrates 2 (lots) under simple control of end points.

If film formation is performed based on a film-formation end point using a time point before the openings 302a are blocked such as a film-formation delay time as a reference (a starting point), film formation cannot be performed in consideration of increase in the film-formation rate for the material gas of the same flow rate after the openings 302a are blocked. When film formation in consideration of increase in the film-formation rate cannot be performed, the film formation is continued for a longer time even after a sufficient film thickness of the tungsten films 321 is formed on the sidewalls 5a. Consequently, the material gas is wastefully consumed. On the other hand, in the present embodiment, increase in the film-formation rate after the openings 302a are blocked is allowed for and a time until the film-formation end point can be set to be relatively short after the openings 302a are blocked. Consequently, the amount of the material gas can be reduced.

Figure 9A:
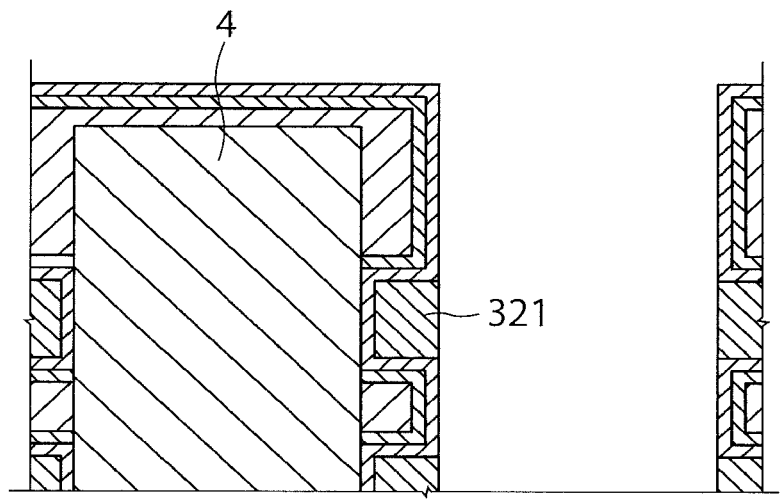
FIGS. 9A and 9B are sectional views showing the semiconductor manufacturing method after FIGS. 8A and 8B.
Figure 9B:
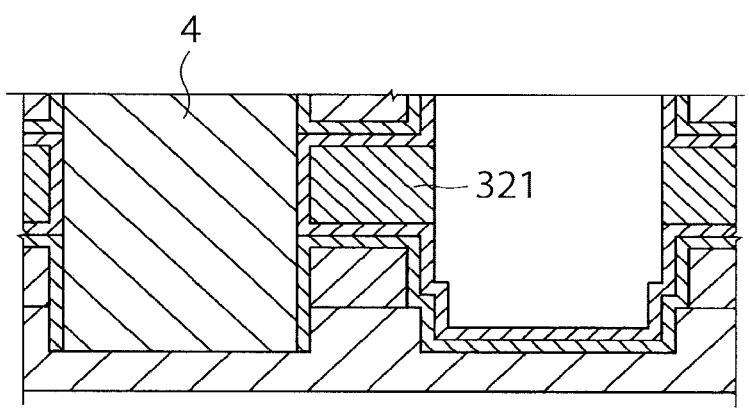

FIGS. 9A and 9B are sectional views showing the semiconductor manufacturing method after FIGS. 8A and 8B. FIG. 9A shows the separated conductive layers 32 near the upper ends of the memory cells 4. FIG. 9B shows the separated conductive layers 32 near the lower ends of the memory cells 4.

As shown in FIGS. 8A and 8B, the tungsten films 321 are formed not only inside the cavities 302 but also on the sidewalls 5a of the trenches 5 and the like. The tungsten films 321 on the sidewalls 5a need to be removed to prevent the upper and lower conductive layers 32 from short-circuiting.

Accordingly, as shown in FIGS. 9A and 9B, the tungsten films 321 on the sidewalls 5a are removed by etching to separate the upper and lower conductive layers 32. At that time, the tungsten film 321 on the upper end of the third stacked film 310 and the tungsten films 321 on the bottoms of the trenches 5 are also removed.

The respective film thicknesses of the tungsten films 321 on the sidewalls 5a in different semiconductor substrates 2 are equal because the tungsten films 321 are formed according to film-formation end points using the opening-blocking time points as references, respectively. Therefore, the tungsten films 321 on the sidewalls 5a in the respective semiconductor substrates 2 can be etched in appropriate amounts under the same etching condition.

As described above, according to the semiconductor manufacturing apparatus 100 and the semiconductor manufacturing method of the present embodiment, a film-formation end point using an opening-blocking time point as a reference is used. Accordingly, an etching condition for separating the upper and lower conductive layers 32 can be uniformed among different semiconductor substrates 2, and consumption of material gas can be reduced. As a result, manufacturing efficiency and economical efficiency in manufacturing semiconductor devices can be improved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing method comprising:
    forming a first film on a semiconductor substrate, the first film being a stacked film in which silicon oxide films and silicon nitride films are stacked alternately;
    forming a recess that penetrates the first film;
    selectively removing the silicon nitride films from the first film through the recess to form cavities in the first film;

transferring the semiconductor substrate in a reaction furnace comprising a gas supplier and a gas discharger; and forming a tungsten-containing film inside the cavity by a CVD method using first gas containing a component of tungsten, while detecting an amount of HF gas as a byproduct at a gas discharge line using infrared spectroscopy, the byproduct being included in a discharge gas from the gas discharger and used to form the tungsten-containing film; wherein the formation of the tungsten-containing film includes:

detecting a first time point at which the cavities are closed with the tungsten-containing film is detected based on the decrease amount of HF gas; and ending forming the tungsten-containing film at a second time point at which a predetermined time has elapsed from the first time point.

2. The method of claim 1, being a manufacturing method of a three-dimensionally stacked semiconductor storage device.

3. The method of claim 2, wherein the tungsten-containing film is to be word lines of the semiconductor storage device.

4. The method of claim 1, wherein the tungsten-containing film is formed from inside of the cavities in respective layers, which are formed based on the stacked film, to a sidewall of the recess, and the method further comprising:

separating parts of the tungsten-containing film that are formed inside the cavities in respective layers from each other by removing parts of the second film that are formed on a sidewall of the recess after forming the tungsten-containing film.

5. The method of claim 1, wherein the amount of HF gas detected after the first time point is approximately one fourth of that detected before the first time point.

6. The method of claim 1, wherein a surface area of the first film after the first time point is approximately 5% to 6% of that before the first time point.

* * * * *